US009669932B2

(12) United States Patent
Murata et al.

(10) Patent No.: US 9,669,932 B2
(45) Date of Patent: Jun. 6, 2017

(54) DISPLAY MOUNTING SYSTEM FOR REDUCED HIC

(71) Applicant: PANASONIC AVIONICS CORPORATION, Lake Forest, CA (US)

(72) Inventors: Tsuneyoshi Murata, Placentia, CA (US); Gary Chen, Rancho Santa Margarita, CA (US); Taku Yamada, Kyoto (JP)

(73) Assignee: Panasonic Avionics Corporation, Lake Forest, CA (US)

( * ) Notice: Subject to any disclaimer, the term of this patent is extended or adjusted under 35 U.S.C. 154(b) by 84 days.

(21) Appl. No.: 14/439,221

(22) PCT Filed: Nov. 8, 2013

(86) PCT No.: PCT/US2013/069227
§ 371 (c)(1),
(2) Date: Apr. 28, 2015

(87) PCT Pub. No.: WO2014/081585
PCT Pub. Date: May 30, 2014

(65) Prior Publication Data
US 2015/0296633 A1 Oct. 15, 2015

Related U.S. Application Data

(60) Provisional application No. 61/728,719, filed on Nov. 20, 2012.

(51) Int. Cl.
*B64D 11/00* (2006.01)
*B64D 11/06* (2006.01)
(Continued)

(52) U.S. Cl.
CPC ............ *B64D 11/06* (2013.01); *B60N 2/4876* (2013.01); *B60R 11/0229* (2013.01);
(Continued)

(58) Field of Classification Search
CPC ..... B60R 2011/0017; B60R 2011/0043; F16B 31/021; B60N 2/4876; B60N 3/004;
(Continued)

(56) References Cited

U.S. PATENT DOCUMENTS 4,523,730 A 6/1985 Martin
5,529,265 A * 6/1996 Sakurai ..................... A47C 7/72
244/118.5

(Continued)

OTHER PUBLICATIONS

International Searching Authority, International Search Report, PCT/US2013/069227, Jan. 10, 2014, United States.
(Continued)

*Primary Examiner* — Anita M King
(74) *Attorney, Agent, or Firm* — Brian Furrer

(57) ABSTRACT

A display for viewing by a passenger from a seat on a vehicle when the display is mounted to structure in front of the passenger when the passenger is seated in the seat. The structure has a recess and a portion surrounding the recess. The display includes an electronic visual display panel for receiving a display signal and displaying information in correspondence therewith to the passenger on the electronic visual display panel. The display further includes a housing in which the electronic visual display panel is mounted or inserted, with the housing including a periphery. At least one fastener is provided including a structural fuse. The structural fuse deforms and/or fractures under force generated by a passenger's head striking the visual display panel in an
(Continued)

accident. Due to crumple of the fuse, movement of the housing is permitted, with the display panel inserted therein, relative to the recess.

20 Claims, 5 Drawing Sheets

(51) Int. Cl.
  *B60N 2/48* (2006.01)
  *B60R 11/02* (2006.01)
  *H05K 5/00* (2006.01)
  *H05K 5/02* (2006.01)
  *B60R 11/00* (2006.01)
  *F16B 31/02* (2006.01)

(52) U.S. Cl.
  CPC ........ *B60R 11/0235* (2013.01); *H05K 5/0017* (2013.01); *H05K 5/0217* (2013.01); *B60R 2011/0017* (2013.01); *B60R 2011/0043* (2013.01); *F16B 31/021* (2013.01)

(58) Field of Classification Search
  CPC . B64D 11/0015; B64D 11/06; B64D 11/0605; B64D 11/0638; H05K 5/0017; H05K 5/0217
  USPC ........................................ 248/694, 548, 909
  See application file for complete search history.

(56) References Cited

U.S. PATENT DOCUMENTS

| | | | | |
|---|---|---|---|---|
| 5,551,817 A | * | 9/1996 | Kanie | F16B 37/0842 411/107 |
| 7,201,354 B1 | * | 4/2007 | Lee | B60R 11/0235 248/231.9 |
| 7,597,393 B1 | * | 10/2009 | Tuccinardi | B60R 11/0211 297/188.04 |
| 7,909,398 B2 | * | 3/2011 | Ling | B60N 2/4876 297/217.6 |
| 8,777,310 B2 | * | 7/2014 | Westerink | B60N 2/4876 297/188.04 |
| 2009/0102256 A1 | | 4/2009 | Staab et al. | |
| 2009/0322125 A1 | | 12/2009 | Berger et al. | |

OTHER PUBLICATIONS

International Searching Authority, Written Opinion, PCT/US2013/069227, Jan. 10, 2014, United States.

* cited by examiner

DISPLAY MOUNTING SYSTEM FOR REDUCED HIC

TECHNICAL FIELD

The present invention relates generally to reducing the risk of injury to passengers in a vehicle accident, and more particularly to reducing the risk of injury to aircraft passengers in the event of an accident.

BACKGROUND

Passenger seats in commercial airplanes are generally arranged in rows, with one seat directly behind the other. When there is a sudden severe deceleration, a passenger is thrown forward against the lap restraint and the passenger's head moves in an arc downward and forward and usually impacts the seat back directly ahead. In the case of a seat row facing a bulkhead, the passenger's head strikes the bulkhead instead of a seat.

To protect passengers from head injury, the Federal Aviation Administration ("FAA") has established a head injury criterion ("HIC") set forth in 14 CFR 23.562 and 25.562. The formula for HIC from the foregoing regulation is reproduced in Formula (1) below:

$$HIC = \left\{ \left[ \frac{1}{t_2 - t_1} \int_{t_1}^{t_2} a(t) dt \right]^{2.5} (t_2 - t_1) \right\}_{max} \quad (1)$$

Wherein:
$t_1$ is the initial integration time in seconds;
$t_2$ is the final integration time in seconds;
$a(t)$ is the resultant deceleration at the center of gravity of a passenger's head in units of gravity.

HIC is normally derived based upon data from an accelerometer mounted at the center of gravity of an anthropomorphic test dummy's head in crash testing. It is an attempt to measure the likelihood of head injury resulting from an impact. When there is potential contact with adjacent seats, structure, or other items in an aircraft, 14 CFR 23.562(c)(5)(i) and 25.562(c)(5)(i) requires the provision of protection such that head impact does not exceed an HIC of 1000. At an HIC of 1000, there is an 18% probability of severe head injury occurrence in an average adult and a 55% probability of serious injury.

The risk of severe head injury tends to increase when the passenger's head strikes rigid, unyielding structure in the seat back or bulkhead. One type of rigid, unyielding, structure often found on the back of seatbacks, are display monitors. Commercial passenger aircraft for longer flights commonly have display monitors mounted on the back of each seat to provide entertainment for passengers and aircraft information. For passengers in rows facing bulkheads, the display monitor is usually mounted to the surface of the bulkhead directly ahead of each facing seat.

A display monitor typically includes metal components, such as a frame or chassis supporting an electronic visual display panel, such as a liquid crystal display ("LCD"). Supported behind the LCD are additional metal components, such as a rear support plate and electronics for receiving display signals and producing images on the electronic visual display panel. In addition, the display monitors are typically mounted with bolts or screws to relatively rigid or unyielding structure in the seat or bulk head so that the display monitor is securely held.

Due to the layout in most passenger aircraft, the display monitors generally lie in the path of travel followed by a passenger's head in the event of sudden severe deceleration. When a passenger's head impacts such an arrangement due to a sudden deceleration, the risk of head injury is increased due to the rigidity of the structure and resulting elevated HIC values.

In addition, 14 CFR 23.785, 25.785 and 29.785 requires a design that is free of potentially injurious objects, sharp edges, protuberances, and hard surfaces in an emergency landing as a result of the dynamic conditions specified in 14 CFR 23.562, 25.562 and 29.562. The requirement is such that a person making proper use of the equipment will not suffer serious injury. Hence it is further desirable that should a passenger's head strike a monitor display due to a sudden deceleration event, that the display not shatter or project sharp edges or protuberances as a result of impact.

Attempts have been made to provide monitor displays that as whole offer less rigidity in an impact. However, the result has generally been a monitor display that undergoes substantial deformation and causes brittle material, such as glass, to break and leave sharp edges exposed. Increasing rigidity tends to decrease the likelihood of exposed sharp edges, but has an adverse affect on HIC value. Embodiments of monitor displays in accordance with the present invention address these competing design goals by improving the interface between a monitor display and the structure to which it mounts.

SUMMARY OF THE INVENTION

In one aspect, an embodiment of a display is disclosed for reduced HIC in a sudden deceleration event. The display is for viewing by a passenger from a seat on a vehicle when the display is mounted to structure in front of the passenger and when the passenger is seated in the seat. The structure has a recess and a portion surrounding the recess.

The display includes an electronic visual display panel for receiving a display signal and displaying information in correspondence therewith to the passenger on the electronic visual display panel. The display further includes a housing in which the electronic visual display panel is mounted or inserted, with the housing including a periphery.

At least one fastener is provided. The fastener includes a first part inserted through one of the periphery of the housing and the portion of the structure surrounding the recess and fastening to the other of the periphery of the housing and the portion of the structure surrounding the recess. When the housing with the electronic visual display panel inserted therein is received in the recess, the fastener includes a second part connected to the first part, which presses the one of the periphery of the housing and the portion of the structure surrounding the recess. This limits movement of the housing with the electronic visual display panel relative to the recess.

The fastener includes a structural fuse that deforms under force generated by a passenger's head striking the electronic visual display panel in an accident and reduces impact force. Due to deformation and fracture of the fuse, movement of the housing is permitted, with the electronic visual display panel inserted therein, relative to the recess.

In one embodiment, the fuse includes a reduced thickness portion of the fastener. Preferably, the reduced thickness portion is formed symmetrically around a central axis of the first part of the fastener. In another embodiment, the fuse includes a washer having at least one area of reduced yield resistance. In more detail, the washer includes a peripheral edge and is used with a spacer including a larger diameter portion having a rim in which the rim of the larger diameter portion abuts the peripheral edge of the washer to form a structural fuse.

From another aspect, an embodiment of a display is described for viewing by a passenger from a seat on a vehicle when the display is mounted to structure in front of the passenger and when the passenger is seated in the seat. The structure has a surface opposing the passenger with a recess therein and a surface facing away from the passenger. The display includes an electronic visual display panel for receiving a display signal and displaying information in correspondence therewith to the passenger on the electronic visual display panel.

The display further includes a housing in which the electronic visual display panel is mounted or inserted. The housing includes a periphery and at least one aperture in the periphery with the aperture having a surrounding portion. At least one fastener is provided having a first part inserted through the aperture and into the surface facing away from the passenger. When the housing with the electronic visual display panel inserted therein is received in the recess of the structure, the fastener includes a second part connected to the first part, in which the second part presses the surrounding portion of the aperture towards the surface facing away from the passenger. The fastener includes a structural fuse that deforms under force generated by a passenger's head subjecting the electronic visual display panel to impact force in an accident (sudden deceleration event).

In one embodiment, the structural fuse is formed by a reduced thickness portion of the fastener. Preferably, the reduced thickness portion is formed symmetrically around a central axis of the fastener. In another embodiment, the structural fuse includes a washer having an area of reduced yield resistance. The washer is used with a spacer including a larger diameter portion having a rim in which the washer includes a peripheral edge. In use, the rim of the larger diameter portion abuts the peripheral edge of the washer to form a structural fuse.

In still another aspect, a method is provided for attaching a display to a structure on a vehicle for viewing by a passenger in a seat on the vehicle. In a preferred embodiment, the method includes providing a recess in the structure, with the recess opposing the seat and the structure having a portion proximate the recess. The method further includes mounting an electronic visual display panel in a housing in which the housing includes a periphery.

The method additionally includes providing a fastener having a shaft, a head, and a structural fuse. The shaft of the fastener is inserted through one of the periphery of the housing and the portion of the structure proximate the recess. Thereafter, the fastener shaft in the method is attached to the other of the periphery of the housing and the portion of the structure proximate the recess. The attachment is such that the fastener head presses against the one of the periphery of the housing and the portion of the structure proximate the recess and limits movement of the housing relative to the recess. The structural fuse deforms by a passenger's head applying impact force to the electronic visual display panel in an accident and reduces impact force due to deformation and fracture of the fuse.

In further detail, providing a fastener includes forming a structural fuse by providing a reduced thickness portion in the shaft of the fastener. Preferably, the reduced thickness portion is formed symmetrically around a central axis of the shaft of the fastener. In another embodiment, the structural fuse is formed by providing a washer having at least one reduced yield resistance portion and disposing the washer on the shaft adjacent the head. In further detail, a spacer is disposed around the shaft of the fastener between the washer and the housing with the spacer including a larger diameter portion having a rim and the washer including a peripheral edge. In this arrangement, the rim of the larger diameter portion of the spacer abuts the peripheral edge of the washer.

Other aspects and advantages will become apparent from the following description, taken in conjunction with the accompanying drawings, illustrating by way of example the principles of the invention.

BRIEF DESCRIPTION OF THE DRAWINGS

The drawing figures are not necessarily to scale and do not represent every feature, but are diagrammatic to enable those of ordinary skill in the art to make and use the invention without undue experimentation and do not limit the scope of the claims. Embodiments in accordance with the invention and advantages will therefore be understood by those of ordinary skill in the art by reference to the detailed description below together with the following drawings figures, wherein:

DETAILED DESCRIPTION OF THE PREFERRED EMBODIMENTS

Figure 1:
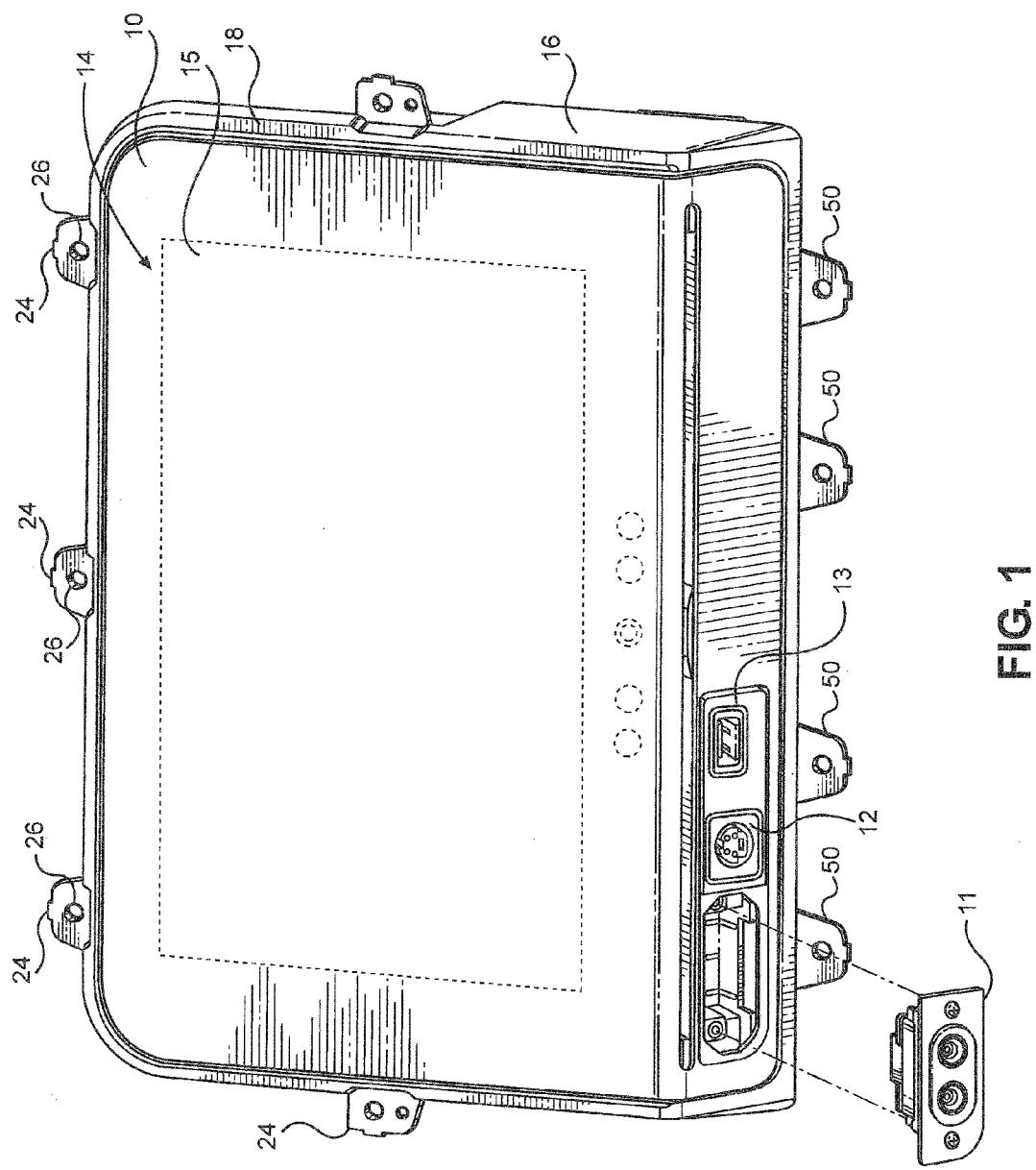
FIG. 1 is a perspective, partially exploded view of a preferred embodiment of a display in accordance with the invention.

FIG. 1 illustrates a perspective, partially exploded schematic view of a preferred embodiment of a display 10 in accordance with the invention. The display 10 is for viewing by a passenger from a seat on a vehicle when the display 10 is mounted to structure in front of the passenger when the passenger is seated in the seat. The structure may be a wall or bulkhead in front of the passenger's seat or the seat back of a seat ahead of the passenger or other structure as explained in more detail in the following paragraphs. FIG. 1 illustrates the display 10 as having various types of ports 11, and 13, such as an audio jack 11 (shown removed), a personal electronic device port 12 for connecting a personal electronic device thereto, and a universal serial bus port (USB port) 13.

Figure 2:
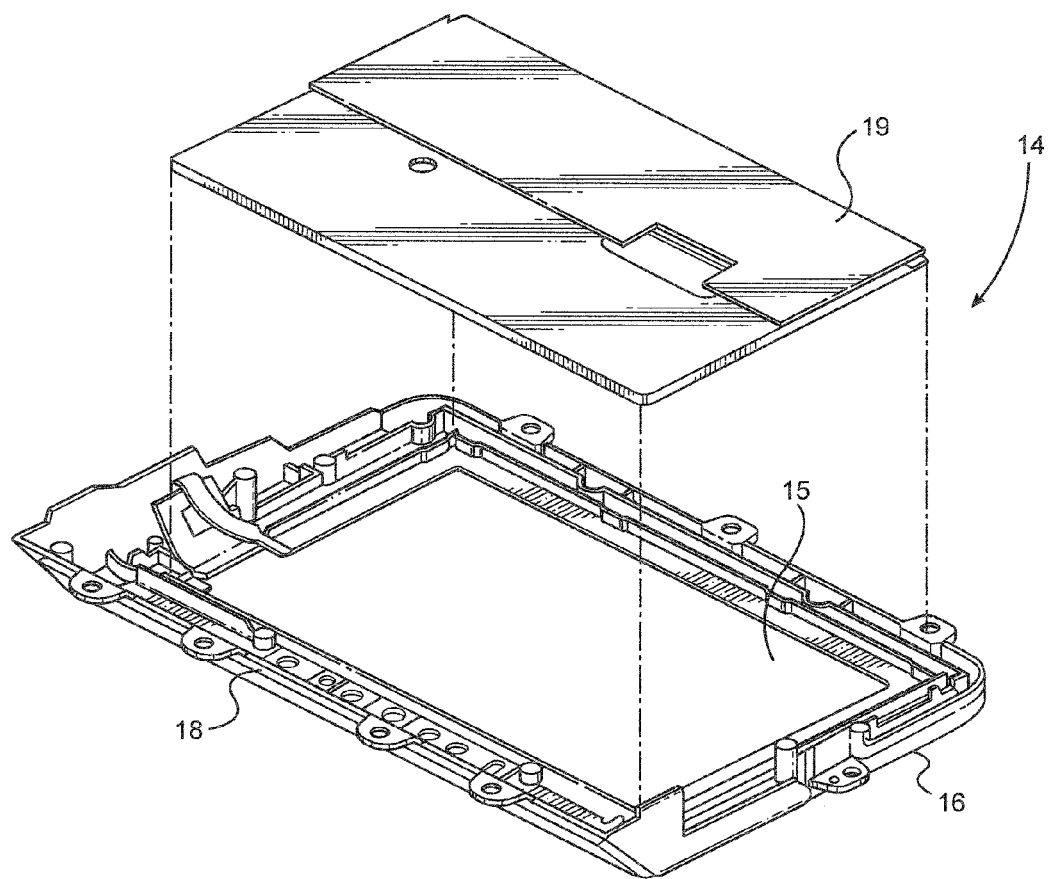
FIG. 2 is a perspective view of part of the display of FIG. 1 illustrating how an electronic visual display panel is mounted or inserted into a housing of the display.

The display 10 includes an electronic visual display panel indicated generally by reference numeral 14 in FIGS. 1 and 2. The electronic visual display panel 14 includes a touch panel 15 and a liquid crystal display 19 (see FIG. 2). The electronic visual display 14 is for receiving a display signal and displaying information in correspondence with the display signal, such as text and images, using the liquid crystal display 19. A liquid crystal display 19 is preferred for displaying the information type due to thinness, light weight, and relatively lower power requirements. However, the electronic visual display panel 14 may include another kind of display apparatus such as plasma or electronic paper or a later developed type.

The electronic visual display panel 14 is mounted or inserted in a housing 16. FIG. 2 illustrates a partial perspective view of the housing 16 and the electronic visual display panel 14. In particular, FIG. 2 illustrates the positioning of the liquid crystal display 19 of the electronic visual display panel 14 as the liquid crystal display 19 is mounted or inserted into the housing 16. After the housing 16 receives the liquid crystal display 19 of the electronic visual display panel 14, a rear cover is added (not shown). The touch panel 15 of the electronic visual display panel 14 is inserted prior to the liquid crystal display 19 to add touch sensitive functionality. Generally, a capacitive type touch panel 15 is preferred due to the ability to distinguish between multiple simultaneous touches. The touch panel 15 is preferably a conventional capacitive type. Such types are available commercially, for example, from Transtouch Technology Inc of Taipei, Taiwan.

Likewise, the liquid crystal display 19 is preferably a conventional type that is commercially available, such as for example, from NEC Corporation of Tokyo, Japan. In FIG. 2, the liquid crystal display 19 is shown being inserted face downward into the housing 16 facing the touch panel 15. That is the viewing side of the liquid crystal display 19 is facing downward in FIG. 2, and the reverse side is facing upward relative to the top of the drawing sheet.

The housing 16 includes a periphery 18 surrounding an open portion of the housing 16. The opening corresponds in shape to the viewing of area of the electronic visual display panel 14, i.e., of the liquid crystal display 19. When the electronic visual display panel 14 is mounted or inserted in the housing 16, the viewing area of the liquid crystal display 19 is exposed through the opening. That is, to view information on the liquid crystal display 19 of the electronic visual display panel 14, one looks through the opening in the housing 14. As the touch panel 15 is formed of a substantially transparent material, the viewing area of the liquid crystal display 19 can be seen through the touch panel 15.

Figure 3:
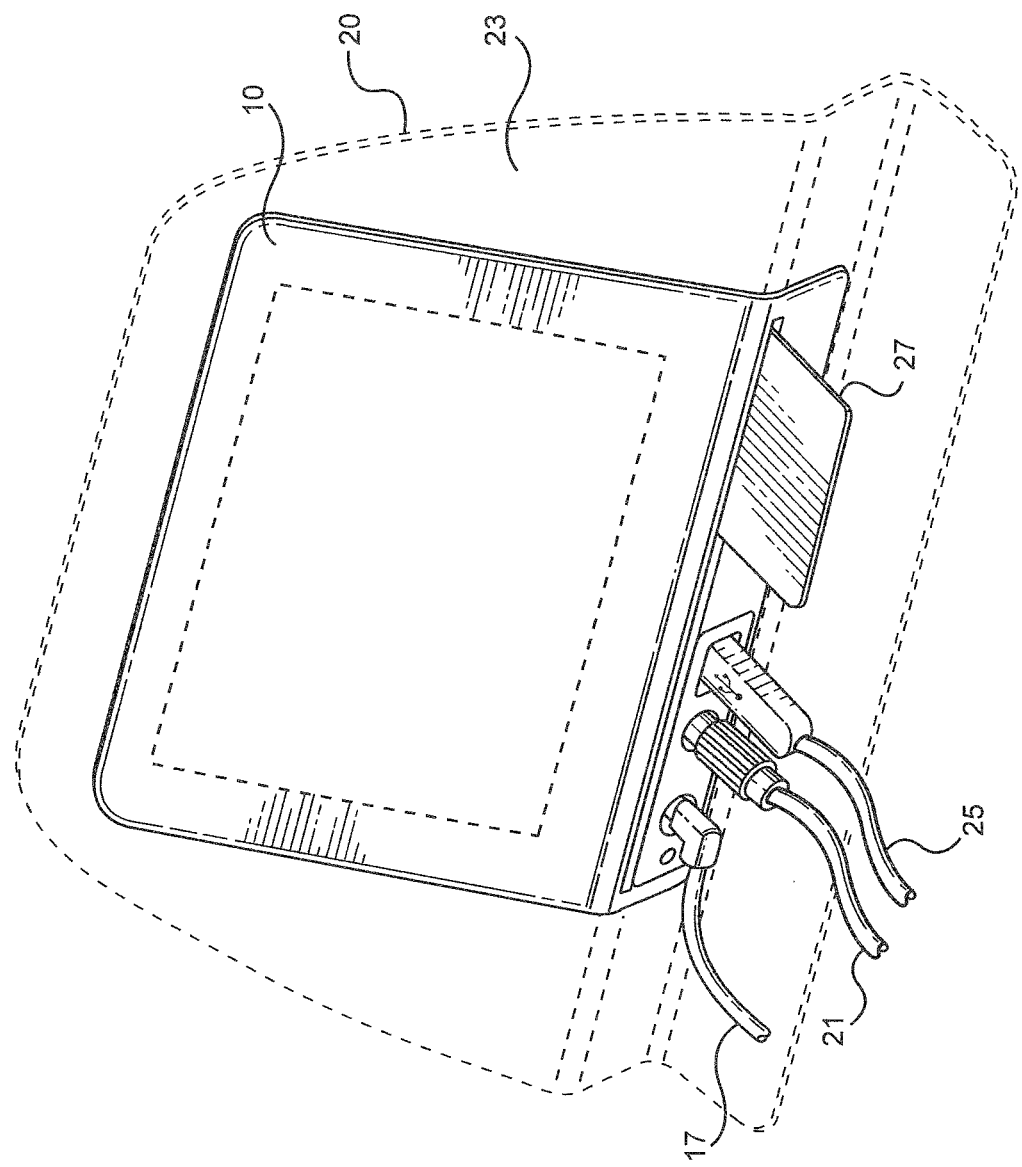
FIG. 3 is a perspective view of the display of FIG. 1 shown mounted to a part of a passenger seat of a vehicle.

FIG. 3 schematically illustrates the display 10 mounted in a seat bezel or part 20 of a passenger seat. This part 20 of the passenger seat forms a section of the back of the seat and includes an opening or recess and a portion surrounding the recess. In FIG. 3, cabling is illustrated connected to the ports 11 and 12 (see FIG. 1), such as cabling 17 and 21 respectively for headphones and a personal electronic device. A USB device 25 is also illustrated inserted in the USB port 13 (see FIG. 1), and a credit card 27 inserted in a credit card slot.

Figure 4:
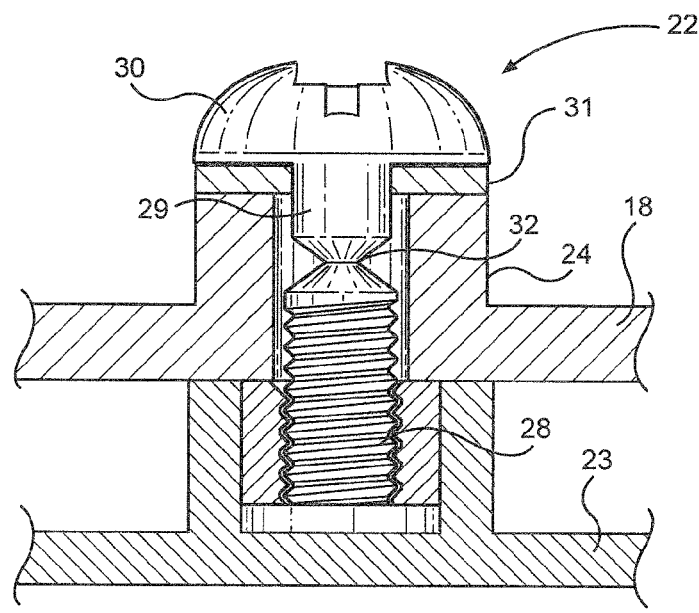
FIG. 4 is a schematic, enlarged, partial cross-sectional view of a portion of the display and of the passenger seat.

With reference to FIG. 4, at least one fastener 22 is inserted through one of the periphery 18 of the housing 16 and a portion 23 of the structure surrounding a recess of the structure 20 to which the display 10 is mounted. In the illustrated embodiment, the fastener 22 extends through the periphery 18 of the housing 16. In particular, the periphery 18 of the housing 16 includes a plurality of outwardly extending mounting tabs 24. Each of the mounting tabs 24 includes a hole or aperture 26. The fastener 22 includes a shaft or first part 29 inserted through the aperture 26 of a mounting tab 24, i.e., through the periphery 18 of the housing 16.

As described above with reference to FIG. 3, the display 10 in the illustrated embodiment is mounted in a seat bezel or part 20 of a passenger seat. That is, to the back of a seat. More particularly, this part 20 of the passenger seat includes a recess and portion 18 surrounding the recess. In the embodiment as illustrated in FIG. 3, the display 10 is mounted to the recess. That is, the shaft or first part 29 of the fastener 22 extends through the periphery 18 of the housing 16 and into the portion 23 surrounding the recess.

Referring to FIG. 4, the shaft or first part 29 of the fastener 22 includes a threaded end 28. The threaded end 28 threadably engages with corresponding female threads in the portion 23 surrounding the recess. The fastener 22 includes a head or second part 30 connected to the shaft or first part 29 of the fastener 22. The head or second part 30 of the fastener 22 presses the periphery 18 of the housing 16 when the fastener 22 is engaged with the portion 23 surrounding the recess of the seat bezel 20. The pressing limits movement of the housing 16 with the electronic visual display panel 14 therein, relative to the recess of the seat bezel 20. Optionally, a washer 31 is disposed between the head or second part 30 of the fastener 22 and the periphery 18 of the housing 16.

The fastener 22 includes a structural fuse 32 that deforms and fractures under force generated by a passenger's head subjecting the electronic visual display panel 14 to impact force in an accident. In the illustrated embodiment, the structural fuse 32 comprises a reduced thickness area of the shaft or first part 29 of the fastener 22. When a passenger's head strikes the electronic visual display panel 14, such as in a sudden deceleration, the structural fuse 32 reduces impact force by necking down and breaking. This permits the display 10 to move and reduce the resulting passenger HIC. The reduced thickness area is preferably formed symmetrically around the central axis of the shaft or first part 29 of the fastener 22.

Figure 5:
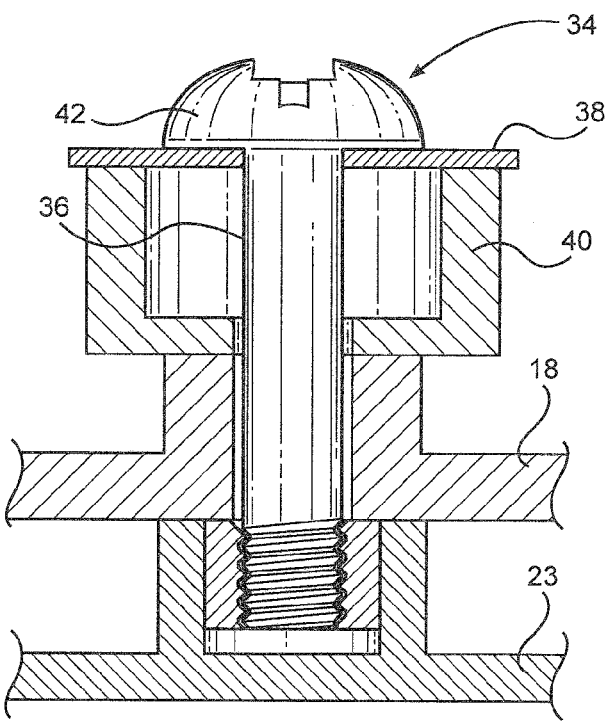
FIG. 5 is an enlarged, schematic partial cross-sectional view of a portion of the display device and of the passenger seat in an alternative embodiment.
Figure 6:
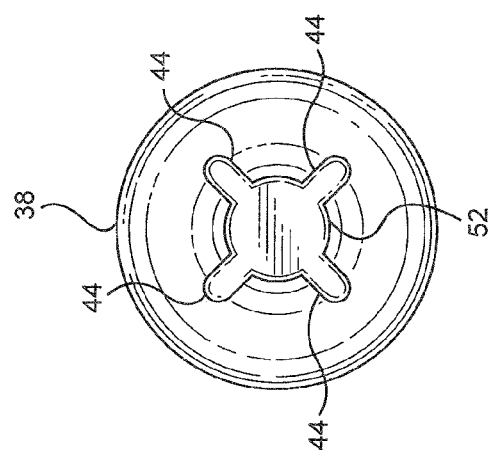
FIG. 6 is a schematic view of a washer from FIG. 5 of the alternative embodiment.

FIGS. 5 though 7 illustrate an alternative preferred embodiment employing a conventional threaded fastener 34, i.e., a bolt or machine screw 34. The shaft or main part 36 of the conventional threaded fastener 34 is passed through a washer 38 and a spacer 40. The washer 38 and spacer 40 are respectively disposed around the shaft or first part 36 of the fastener 34 between the head or second part 42 of the fastener 34 and the periphery 18 of the housing 16. The washer 38 and spacer 40 together form a structural fuse due to at least one area 44 of reduced yield resistance included in the washer 38 as can be seen in FIG. 6. Preferably, there is a plurality of areas 44 of reduced yield resistance arranged symmetrically around the central axis of the washer 38. As shown, the areas 44 of reduced yield resistance correspond to sections extending from the central aperture 52 of the washer, where the material forming the washer has been removed to form openings in the shape of lobes extending from the central aperture of the washer 38. In alternative embodiments, break lines or creases could be formed instead of sections with removed material.

Figure 7:
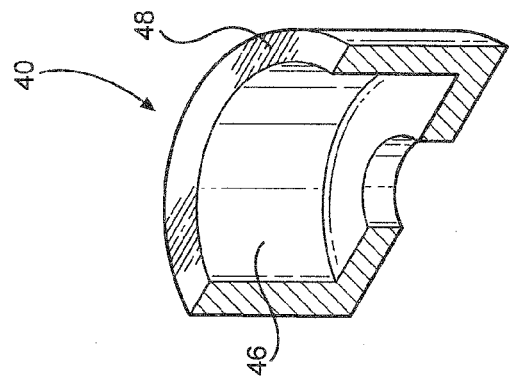
FIG. 7 is a schematic, cross-sectional perspective view of a spacer from FIG. 5 of the alternative embodiment.

Referring to FIG. 7, the spacer 40 includes a larger diameter portion 46 having a rim 48. The rim 48 of the larger diameter portion 46 abuts the peripheral edge of the washer 38. When a passenger's head strikes the display 10 due to a sudden severe deceleration, the washer 38 deforms due to the areas 44 of reduced yield resistance. This in turn permits the head or second part 42 of the fastener 34 to move into the spacer 40 and permits the display 10 to move relative to the recess of the seat bezel 20 to reduce passenger HIC.

Returning to the first described embodiment, a structural analysis was performed to estimate the forces that would likely be generated if the display 10 was struck by a passenger's head in a sudden deceleration event. A HIC value of 1000 was assumed. In addition, the analysis assumed the fastener 22 was formed of a conventional pan head Phillips machine screw of size #8-32.

Figure 8:
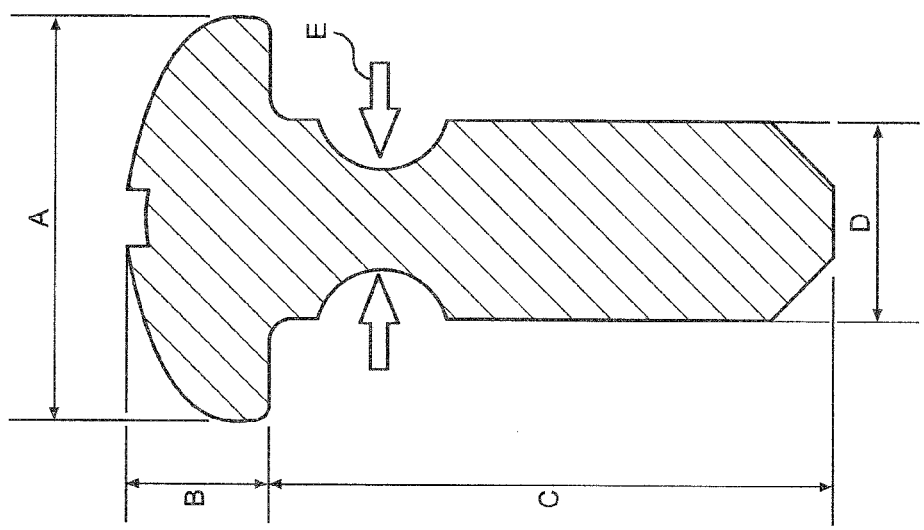
FIG. 8 is a dimensioned schematic model of a fastener used for structural analysis.

FIG. 8 illustrates a dimensioned model of the screw. In the model, dimensions A and B were respectively 0.306 and 0.105 inches. The shaft length, dimension C, was 0.438 inches. The shaft diameter D was 0.164 inches. While threads are not shown for ease of illustration, threads were assumed in accordance with the size #8-32, i.e., thirty-two (32) threads per inch.

The analysis showed that forces of several hundred pounds of tension could be produced in a fastener 22 of the foregoing size. To ensure that that the structural fuse 32 deforms under such impact force and breaks to maintain passenger HIC to less than one thousand (1000), a fastener 22 formed of stainless steel preferably has a reduced area diameter E of 0.55 inches maximum (1.40 mm). That is, the diameter E must be no greater than 0.55 inches. For the same fastener 22 formed of aluminum, the maximum diameter E is preferably 0.0984 inches (2.5 mm) at most.

In alternative embodiments, the fastener 22 is formed of a material other than a metal or metal alloy, for example, such as a plastic or thermoplastic material. For instance, the fastener is formed of a polyamide, i.e., synthetic polymer, such as nylon, preferably a high temperature nylon, for example, nylon 46, which is frequently used in the automotive industry. Nylon 46 is also known as polytetramethyleneadipamide and has a melting temperature of approximately 295 degrees Celsius. Relative to a metal or metal alloy such as aluminum or steel, nylon fractures under less tensile force. According to the above described analysis and dimensions as indicated for FIG. 8, a fastener 22 formed of nylon does not require an area of reduced thickness E to ensure that the structural fuse 32 will deform in a sudden deceleration event to reduce passenger HIC to less than one thousand (1000).

As will be appreciated by those of ordinary skill in the art, a structural fuse 32 as described in the foregoing embodiments reduces the likelihood of potentially injurious objects, sharp edges or protuberances extending from the display 10 in an impact event. Namely, impact force is reduced through elongation of the structural fuse, reducing the likelihood that components will shatter and protrude from the display 10, such as an LCD for example, of the electronic visual display panel 14.

Preferably, conventional fasteners may be used with the mounting tabs 50 along the lower portion of the periphery 18 of the display 10 as shown in FIG. 1. In this arrangement, the structural fuses 32 along the top and sides deform, and the display 10 pivots about the lower mounting tabs 50 having conventional fasteners in an impact event to reduce HIC.

An advantage of the described embodiments is that each embodiment provides for a deformable interface between the display 10 and the structure to which the display attaches. The deformable interface is formed by the fasteners 22 or 34, which deform and/or break in a sudden deceleration event if the display 10 is struck by a passenger's head. This permits the display 10 to be formed of more rigid materials that tend to prevent the display 10 from exposing sharp edges and protuberances as a result of impact, while maintaining HIC less than 1000 for the passenger.

Various changes and modifications can be made to the described embodiments without departing from the spirit and scope of the invention as will be recognized by those of ordinary skill in the art. For example, instead of employing mounting tabs 24, the periphery 18 could be extended to form a continuous lip around the display 10 having apertures 26. Instead of a fastener 22 that inserts through the periphery 18 of the display 10, the fastener 22 could be reversed to insert through a portion 23 of the mounting structure and thread into the periphery 18 of the display 10, i.e., threadably engage with internal threads formed in mounting tabs 24. Instead of a washer 38 having areas 44 of reduced yield resistance, the washer 38 could be formed of a plastic or thermoplastic material. Nylon 66 could be used instead of nylon 46, or other types of nylon. The area of reduced thickness could be made asymmetrically relative to the central axis of the shaft or first part 29 of the fastener 22. The electronic visual display panel 14 may not include a touch panel 15 or may have a touch panel 15 of a type other than capacitive, such as resistive. The electronic visual display panel 14 may include a substantially transparent outer surface for providing scratch resistance in addition to a touch panel 15.

While the above-described embodiments are intended for use on a vehicle that must meet FAA requirements such as on aircraft, the display could be used on other types of vehicles, for instance, trains or busses. Since changes can be made as described, the present examples and embodiments are to be considered as illustrative and not restrictive and the invention is not to be limited to the details given herein, but may be modified within the scope and equivalence of the appended claims.

The invention claimed is:

1. A display for viewing by a passenger from a seat on a vehicle when the display is mounted to structure in front of the passenger when the passenger is seated in the seat, the structure having a recess and a portion surrounding the recess, the display comprising:
   an electronic visual display panel for receiving a display signal and displaying information in correspondence therewith to the passenger on the electronic visual display panel;
   a housing in which the electronic visual display panel is inserted, the housing having a periphery;
   at least one fastener including a first part inserted through one of the periphery of the housing and the portion of the structure surrounding the recess and fastening to the other of the periphery of the housing and the portion of the structure surrounding the recess, when the housing with the electronic visual display panel inserted therein is received in the recess, the fastener having a second part connected to the first part and pressing said one of the periphery of the housing and the portion of the structure surrounding the recess and limiting movement of the housing with the electronic visual display panel relative to the recess, the fastener including a structural fuse comprising a reduced thickness portion of the fastener that deforms under force generated by a passenger's head striking the electronic visual display panel in an accident and due to elongation of the reduced thickness portion, permits movement of the housing, with the electronic visual display panel inserted therein, relative to the recess.

2. The display of claim 1, wherein the reduced thickness portion of the fastener is formed in said first part of the fastener.

3. The display of claim 2, wherein said first part of the fastener comprises a threaded shaft and the reduced thickness portion is formed symmetrically around a central axis of the threaded shaft of the fastener.

4. The display of claim 1, wherein there is a plurality of fasteners.

5. The display of claim 1, wherein the periphery includes a portion forming an upper edge of the housing and another portion forming the lower edge of the housing, and the first part of the fastener is inserted through one of the upper edge of the housing and the portion of the structure surrounding the recess and fastening to the other of the upper edge of the housing and the portion of the structure surrounding the recess.

6. A display for viewing by a passenger from a seat on a vehicle when the display is mounted to structure in front of the passenger when the passenger is seated in the seat, the structure having a recess and a portion surrounding the recess, the display comprising:
 an electronic visual display panel for receiving a display signal and displaying information in correspondence therewith to the passenger on the electronic visual display panel;
 a housing in which the electronic visual display panel is inserted, the housing having a periphery;
 at least one fastener including a first part inserted through one of the periphery of the housing and the portion of the structure surrounding the recess and fastening to the other of the periphery of the housing and the portion of the structure surrounding the recess, when the housing with the electronic visual display panel inserted therein is received in the recess, the fastener having a second part connected to the first part and pressing said one of the periphery of the housing and the portion of the structure surrounding the recess and limiting movement of the housing with the electronic visual display panel relative to the recess, the fastener including a structural fuse that deforms under force generated by a passenger's head striking the electronic visual display panel in an accident and due to crumple of the fuse, permits movement of the housing, with the electronic visual display panel inserted therein, relative to the recess, wherein the fastener comprises a washer disposed around the first part of the fastener between the second part of the fastener and said one of the periphery of the housing and the portion of the structure surrounding the recess, the washer including an area of reduced yield resistance.

7. The display of claim 6, further comprising a spacer disposed around the first part of the fastener between the washer and said one of the periphery of the housing and the portion of the structure surrounding the recess, the spacer including a larger diameter portion having a rim and the washer including a peripheral edge, in which the rim of the larger diameter portion abuts the peripheral edge of the washer.

8. A display for viewing by a passenger from a seat on a vehicle when the display is mounted to structure in front of the passenger when the passenger is seated in the seat, the structure having a recess and a portion surrounding the recess, the display comprising:
 an electronic visual display panel for receiving a display signal and displaying information in correspondence therewith to the passenger on the electronic visual display panel;
 a housing in which the electronic visual display panel is inserted, the housing having a periphery;
 at least one fastener including a first part inserted through one of the periphery of the housing and the portion of the structure surrounding the recess and fastening to the other of the periphery of the housing and the portion of the structure surrounding the recess, when the housing with the electronic visual display panel inserted therein is received in the recess, the fastener having a second part connected to the first part and pressing said one of the periphery of the housing and the portion of the structure surrounding the recess and limiting movement of the housing with the electronic visual display panel relative to the recess, the fastener including a structural that deforms under force generated by a passenger's head striking the electronic visual display panel in an accident and due to crumple of the fuse, permits movement of the housing, with the electronic visual display panel inserted therein, relative to the recess,
 wherein the periphery includes a portion forming an upper edge of the housing and another portion forming the lower edge of the housing, and the first part of the fastener is inserted through one of the upper edge of the housing and the portion of the structure surrounding the recess and fastening to the other of the upper edge of the housing and the portion of the structure surrounding the recess, wherein a fastener devoid of a structural fuse is inserted through one of the lower edge of the housing and the portion of the structure surrounding the recess and fastening to the other of the lower edge of the housing and the portion of the structure surrounding the recess.

9. A display for viewing by a passenger from a seat on a vehicle when the display is mounted to structure in front of the passenger when the passenger is seated in the seat, the structure having a surface opposing the passenger with a recess therein and a surface facing away from the passenger, the display comprising:
 an electronic visual display panel for receiving a display signal and displaying information in correspondence therewith to the passenger on the electronic visual display panel;
 a housing in which the electronic visual display panel is inserted, the housing having a periphery and including at least one aperture in the periphery, the aperture having a surrounding portion;
 at least one fastener having a first part inserted through the aperture and into the surface facing away from the passenger when the housing with the electronic visual display panel inserted therein is received in the recess of the structure, the fastener having a second part connected to the first part and pressing the surrounding portion of the aperture towards the surface facing away from the passenger, the fastener including a structural fuse that deforms by elongation by the passenger's head subjecting the electronic visual display panel to impact force in an accident.

10. The display of claim 9, wherein the structural fuse comprises a reduced thickness portion of the fastener.

11. The display of claim 10, wherein the reduced thickness portion is formed symmetrically around a central axis of the first part of the fastener.

12. A display for viewing by a passenger from a seat on a vehicle when the display is mounted to structure in front of the passenger when the passenger is seated in the seat, the structure having a surface opposing the passenger with a recess therein and a surface facing away from the passenger, the display comprising:
 an electronic visual display panel for receiving a display signal and displaying information in correspondence therewith to the passenger on the electronic visual display panel;
 a housing in which the electronic visual display panel is inserted, the housing having a periphery and including at least one aperture in the periphery, the aperture having a surrounding portion;

at least one fastener having a first part inserted through the aperture and into the surface facing away from the passenger when the housing with the electronic visual display panel inserted therein is received in the recess of the structure, the fastener having a second part connected to the first part and pressing the surrounding portion of the aperture towards the surface facing away from the passenger, the fastener including a structural fuse that deforms by the passenger's head subjecting the electronic visual display panel to impact force in an accident, wherein the structural fuse comprises a washer disposed around the first part of the fastener between the second part of the fastener and the housing, the washer including an area of reduced yield resistance.

13. The display of claim 12, further comprising a spacer disposed around the first part of the fastener between the washer and the housing, the spacer including a larger diameter portion having a rim and the washer including a peripheral edge, in which the rim of the larger diameter portion abuts the peripheral edge of the washer.

14. A method for attaching a display to a structure on a vehicle for viewing by a passenger in a seat on the vehicle, the method comprising:
providing a recess in the structure, with the recess opposing the seat and the structure having a portion proximate the recess;
mounting an electronic visual display panel in a housing, in which the housing includes a periphery;
providing a fastener including a shaft, a head, and a structural fuse;
inserting the shaft of the fastener through one of the periphery of the housing and the portion of the structure proximate the recess and attaching the fastener shaft to the other of the periphery of the housing and the portion of the structure proximate the recess, such that the head of the fastener presses against said one of the periphery of the housing and the portion of the structure proximate the recess and limits movement of the housing relative to the recess, wherein a structural fuse deforms by elongation and fractures by a passenger's head applying impact force to the electronic visual display panel in an accident and reduces impact force and head injury criterion value due to deformation and fracture of the fuse.

15. The method of claim 14, where said providing a fastener including a shaft, a head, and a structural fuse, includes forming a structural fuse by providing a reduced thickness portion in the shaft of the fastener.

16. The method of claim 15, wherein the reduced thickness portion is formed symmetrically around a central axis of the shaft of the fastener.

17. A method for attaching a display to a structure on a vehicle for viewing by a passenger in a seat on the vehicle, the method comprising:
providing a recess in the structure, with the recess opposing the seat and the structure having a portion proximate the recess;
mounting an electronic visual display panel in a housing, in which the housing includes a periphery;
providing a fastener including a shaft, a head, and a structural fuse;
inserting the shaft of the fastener through one of the periphery of the housing and the portion of the structure proximate the recess and attaching the fastener shaft to the other of the periphery of the housing and the portion of the structure proximate the recess, such that a head of the fastener presses against said one of the periphery of the housing and the portion of the structure proximate the recess and limits movement of the housing relative to the recess, wherein a structural fuse deforms and fractures by a passenger's head applying impact force to the electronic visual display panel in an accident and reduces impact force and head injury criterion value due to deformation and fracture of the fuse, wherein said providing a fastener including a shaft, a head, and a structural fuse, includes forming a structural fuse by providing a washer having at least one reduced yield resistance portion, in which the washer is disposed on the shaft adjacent the head.

18. The method of claim 17, wherein said forming a structural fuse includes disposing a spacer around the shaft of the fastener between the washer and the housing with the spacer including a larger diameter portion having a rim and the washer including a peripheral edge, in which the rim of the larger diameter portion abuts the peripheral edge of the washer.

19. The method of claim 17, wherein a plurality of reduced yield resistance portions are formed.

20. The method of claim 19, wherein the washer includes a central aperture and the reduced yield resistance portions correspond to sections of the washer where material has been removed to form lobes extending from the central aperture.

* * * * *